(12) United States Patent
Ueki

(10) Patent No.: US 12,093,765 B2
(45) Date of Patent: *Sep. 17, 2024

(54) RFID TAG RFIC MODULE AND RFID TAG

(71) Applicant: Murata Manufacturing Co., Ltd., Nagaokakyo (JP)

(72) Inventor: Noriyuki Ueki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 565 days.

This patent is subject to a terminal disclaimer.

(21) Appl. No.: 17/363,751

(22) Filed: Jun. 30, 2021

(65) Prior Publication Data

US 2021/0326668 A1    Oct. 21, 2021

Related U.S. Application Data

(63) Continuation of application No. PCT/JP2020/036707, filed on Sep. 28, 2020.

(30) Foreign Application Priority Data

Feb. 25, 2020 (JP) .................. 2020-029451

(51) Int. Cl.
*G06K 19/07* (2006.01)
*G06K 19/077* (2006.01)
*H03H 7/38* (2006.01)

(52) U.S. Cl.
CPC ... *G06K 19/0723* (2013.01); *G06K 19/07752* (2013.01); *G06K 19/07779* (2013.01); *H03H 7/38* (2013.01)

(58) Field of Classification Search
CPC ............. G06K 19/0723; G06K 19/077; G06K 19/07752; G06K 19/07779; H01Q 1/38; H01Q 1/50; H01Q 9/16; H03H 7/38
See application file for complete search history.

(56) References Cited

U.S. PATENT DOCUMENTS

| 2012/0206239 | A1* | 8/2012 | Ikemoto | ............... H04B 5/0081 |
| | | | | 340/10.1 |
| 2017/0017872 | A1* | 1/2017 | Kato | ................ G06K 19/07722 |
| 2017/0083804 | A1* | 3/2017 | Kato | ................ G06K 19/07786 |
| 2019/0386376 | A1 | 12/2019 | Kato | |

FOREIGN PATENT DOCUMENTS

| JP | 2000090207 A | 3/2000 |
| WO | 2016084658 A1 | 6/2016 |
| WO | 2018164255 A1 | 9/2018 |

OTHER PUBLICATIONS

International Search Report issued for PCT/JP2020/036707, date of mailing Dec. 8, 2020.

* cited by examiner

*Primary Examiner* — Omer S Khan
(74) *Attorney, Agent, or Firm* — ArentFox Schiff LLP

(57) ABSTRACT

An RFIC module is provided that includes an RFIC, an antenna connection first electrode, an antenna connection second electrode, an RFIC connection first electrode, an RFIC connection second electrode, an impedance matching circuit that matches impedance between the RFIC and an antenna, and a substrate. The impedance matching circuit includes a first coil and a second coil that each have a coil opening extending along a surface of the substrate. The first coil and the second coil are juxtaposed on the substrate with the antenna connection first electrode and the antenna connection second electrode interposed therebetween.

16 Claims, 8 Drawing Sheets

RFID TAG RFIC MODULE AND RFID TAG

CROSS REFERENCE TO RELATED APPLICATIONS

The present application is a continuation of PCT/JP2020/036707 filed Sep. 28, 2020, which claims priority to Japanese Patent Application No. 2020-029451, filed Feb. 25, 2020, the entire contents of each of which are incorporated herein by reference.

TECHNICAL FIELD

The present invention relates to an RFID tag RFIC module forming a part of an RFID tag, and further relates to the RFID tag including the RFID tag RFIC module.

BACKGROUND

WO 2016/084658 A (hereinafter "Patent Literature 1") discloses an example of a Radio Frequency Identifier (RFID) tag including a Radio Frequency Integrated Circuit (RFIC) module. This RFID tag is formed by mounting an RFIC module on an antenna base material on which an antenna is formed. The RFIC module includes an RFIC and an impedance matching circuit that matches impedance between the RFIC and the antenna.

An effort to thin/downsize the RFIC module having the structure described in Patent Literature 1 results in the plurality of coils forming the impedance matching circuit being extremely close to each other. When the coils are close to each other in this configuration, unwanted coupling occurs depending on a winding direction of the coil or a coil shape, and characteristics of the RFIC module and the RFID tag may deteriorate.

In general, when the characteristics of the RFID tag are inspected in the manufacturing stage of the RFID tag, the RFID tag reader reads the RFID tag. If the inspection can be performed with the RFIC module alone, the inspection efficiency can increase significantly.

In order to perform the inspection with the RFIC module alone, it is necessary to detect a magnetic field leaking to the outside in a contactless manner. However, in an RFIC module used in a conventional RFID tag reader, coils forming an impedance matching circuit are arranged in a positional relationship in which the coils are arranged between two antenna connection electrodes in a plane direction. Therefore, the coils forming the impedance matching circuit are shielded by the antenna connection electrode, and thus the magnetic field leakage to the outside is small. Therefore, contactless inspection has been difficult to perform with the conventional RFIC module.

SUMMARY OF THE INVENTION

In view of the above, an object of the exemplary embodiments of the present invention is to provide an RFIC module and an RFID tag with which unwanted coupling between a plurality of coils forming an impedance matching circuit between an RFIC and an antenna is suppressed. A further object of the exemplary embodiments of the present invention is to provide an RFID tag RFIC module that can be used alone for inspecting characteristic measurement and the like and an RFID tag.

Thus, in one exemplary aspect, an RFID tag RFIC module is provided that includes an RFIC; an antenna connection first electrode; an antenna connection second electrode; an RFIC connection first electrode; an RFIC connection second electrode; and an impedance matching circuit that is connected to the RFIC connection first electrode and the RFIC connection second electrode, and the antenna connection first electrode and the antenna connection second electrode, and matches impedance between the RFIC and an antenna. The RFID tag RFIC module further includes a substrate on which the RFIC connection first electrode, the RFIC connection second electrode, the antenna connection first electrode, the antenna connection second electrode, and the impedance matching circuit are formed, and on which the RFIC is mounted. The impedance matching circuit includes a first coil and a second coil that are connected to the RFIC connection first electrode and the RFIC connection second electrode and each have a coil opening extending along a surface of the substrate. Moreover, the first coil and the second coil are juxtaposed in/on the substrate with the antenna connection first electrode and the antenna connection second electrode interposed therebetween.

Moreover, in another exemplary aspect, an RFID tag is provided that includes an antenna; an RFIC; an antenna connection first electrode; an antenna connection second electrode; an RFIC connection first electrode; an RFIC connection second electrode; and an impedance matching circuit that is connected to the RFIC connection first electrode and the RFIC connection second electrode, and the antenna connection first electrode and the antenna connection second electrode, and that matches impedance between the RFIC and the antenna. Moreover, a substrate is provided on which at least the RFIC connection first electrode, the RFIC connection second electrode, the antenna connection first electrode, the antenna connection second electrode, and the impedance matching circuit are formed. The impedance matching circuit includes a first coil and a second coil that are connected to the RFIC connection first electrode and the RFIC connection second electrode, with each having a coil opening extending along a surface of the substrate. The first coil and the second coil are juxtaposed in/on the substrate with the antenna connection first electrode and the antenna connection second electrode interposed therebetween.

With the above configuration, unwanted coupling between the coils included in the impedance matching circuit is suppressed by the antenna connection first electrode and the antenna connection second electrode. In addition, a leakage magnetic field from the coils included in the impedance matching circuit to the outside becomes strong, resulting in stronger magnetic field coupling with an external magnetic field probe.

According to the exemplary embodiments of the present invention, an RFIC module and an RFID tag is provided with which unwanted coupling between a plurality of coils forming an impedance matching circuit between an RFIC and an antenna is suppressed. In addition, an RFID tag RFIC module that can be used alone for inspecting characteristic measurement and the like and an RFID tag can be provided.

BRIEF DESCRIPTION OF DRAWINGS

FIG. 6 is a view illustrating a relationship between the RFIC module 101 and a measurement instrument 301 and the like.

DETAILED DESCRIPTION OF EMBODIMENTS

Figure 1:
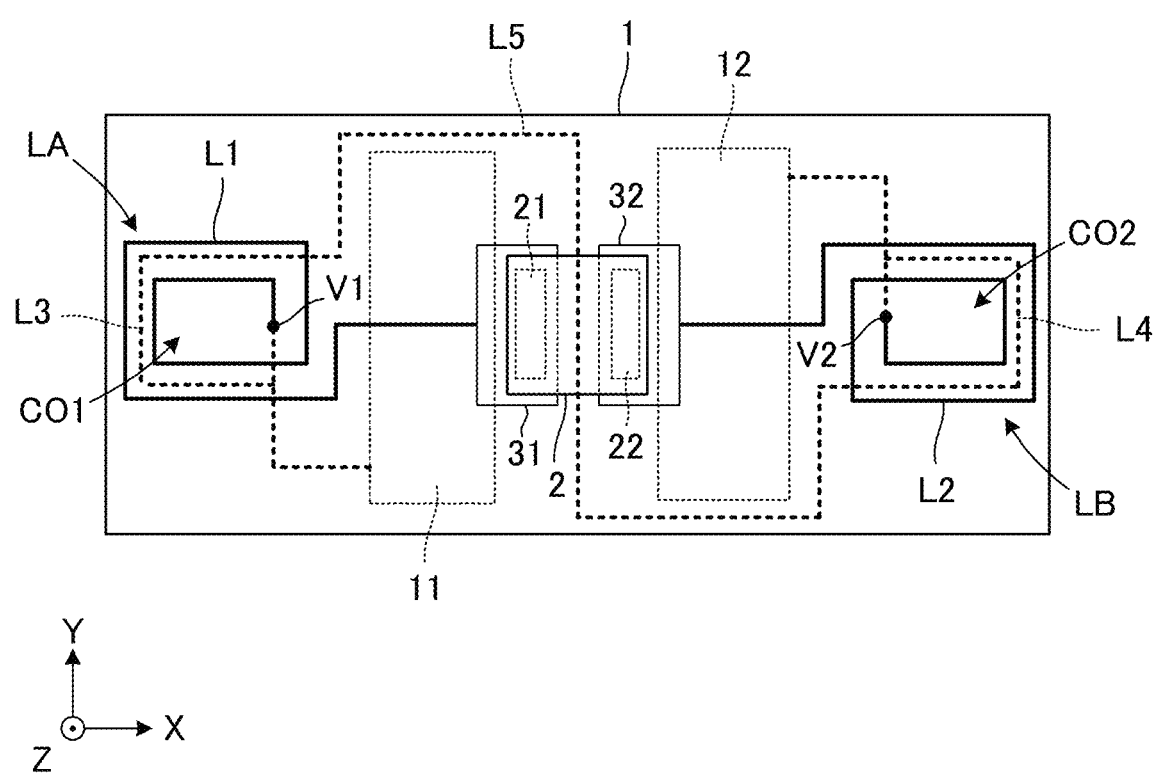
FIG. 1 is an enlarged plan view of an RFIC module 101 according to a first exemplary embodiment.

Hereinafter, a plurality of exemplary embodiments are described with some specific examples with reference to the drawings. In each drawing, the same parts are designated by the same reference numerals. Although embodiments are described separately, for convenience of the description of the embodiments, in consideration of the description of main points or the ease of understanding, configurations described in different embodiments can be partially replaced or combined. In second and subsequent embodiments, a description of matters common to a first embodiment will be omitted, and only different points will be described. In particular, similar effects obtained by a similar configuration will not be sequentially described for each embodiment.

First Exemplary Embodiment

FIG. 1 is an enlarged plan view of an RFID tag RFIC module (hereinafter, it is simply referred to as an "RFIC module".) 101 according to a first embodiment.

The RFIC module 101 includes an RFIC 2, an antenna connection first electrode 11, an antenna connection second electrode 12, an RFIC connection first electrode 31, an RFIC connection second electrode 32, an impedance matching circuit, and a substrate 1.

The impedance matching circuit is connected between the RFIC connection first electrode 31 and the RFIC connection second electrode 32, and the antenna connection first electrode 11 and the antenna connection second electrode 12, and matches the impedance between the RFIC 2 and the antenna.

As shown, the RFIC connection first electrode 31, the RFIC connection second electrode 32, the antenna connection first electrode 11, the antenna connection second electrode 12, and the impedance matching circuit are formed on the substrate 1. RFIC terminal electrodes 21 and 22 are formed on a lower surface of the RFIC 2, and the RFIC 2 is mounted on the substrate 1 with the RFIC terminal electrodes 21 and 22 connected to the RFIC connection electrodes 31 and 32, respectively. An insulator layer formed by resin molding covers a mounting surface of the RFIC 2 of the substrate 1. It is noted that FIG. 1 is a plan view before the resin molding.

The impedance matching circuit includes a first coil LA and a second coil LB that are connected to the RFIC connection first electrode 31 and the RFIC connection second electrode 32, respectively, and each have a coil opening extending along the surface of the substrate 1. According to the coordinate system illustrated in FIG. 1, the coil winding axis of the first coil LA is parallel to (i.e., extends in) the Z axis, and has the coil opening parallel to the X-Y plane. Similarly, the coil winding axis of the second coil LB is parallel to the Z axis, and the coil opening thereof is parallel to the X-Y plane. Thus, the coil winding axes extend orthogonally to the surface of the substrate 1.

The first coil LA and the second coil LB are juxtaposed in/on the substrate 1 with the antenna connection first electrode 11 and the antenna connection second electrode 12 interposed therebetween. The coil opening CO1 of the first coil LA is a region surrounded by the innermost circumference of the conductor pattern forming the first coil LA, and the coil opening CO2 of the second coil LB is a region surrounded by the innermost circumference of the conductor pattern forming the second coil LB.

According to the exemplary aspect, the first coil LA includes a coil forming a first inductor L1 connected to the RFIC connection first electrode 31 and the antenna connection first electrode 11, and a coil forming a third inductor L3 connected in series between the antenna connection first electrode 11 and the antenna connection second electrode 12. In this aspect, each of the coils has a spiral shape. The second coil LB includes a coil forming a second inductor L2 connected to the RFIC connection second electrode 32 and the antenna connection second electrode 12, and a coil forming a fourth inductor L4 connected in series between the antenna connection first electrode 11 and the antenna connection second electrode 12. Similarly, in this aspect, each of the coils has a spiral shape.

The coil forming the first inductor L1 is formed on the upper surface of the substrate 1, and the coil forming the third inductor L3 is formed on the lower surface of the substrate 1. The coil forming the first inductor L1 and the coil forming the third inductor L3 are connected via an interlayer connection conductor V1. The coil forming the second inductor L2 is formed on the upper surface of the substrate 1, and the coil forming the fourth inductor L4 is formed on the lower surface of the substrate 1. The coil forming the second inductor L2 and the coil forming the fourth inductor L4 are connected via an interlayer connection conductor V2.

The coil forming the third inductor L3 and the coil forming the fourth inductor L4 are connected to each other via a conductor pattern forming a fifth inductor L5.

As further shown, the coil opening of the coil forming the first inductor L1 and the coil opening of the coil forming the third inductor L3 overlap, and the coil opening of the coil forming the second inductor L2 and the coil opening of the coil forming the fourth inductor L4 overlap.

Figure 2:
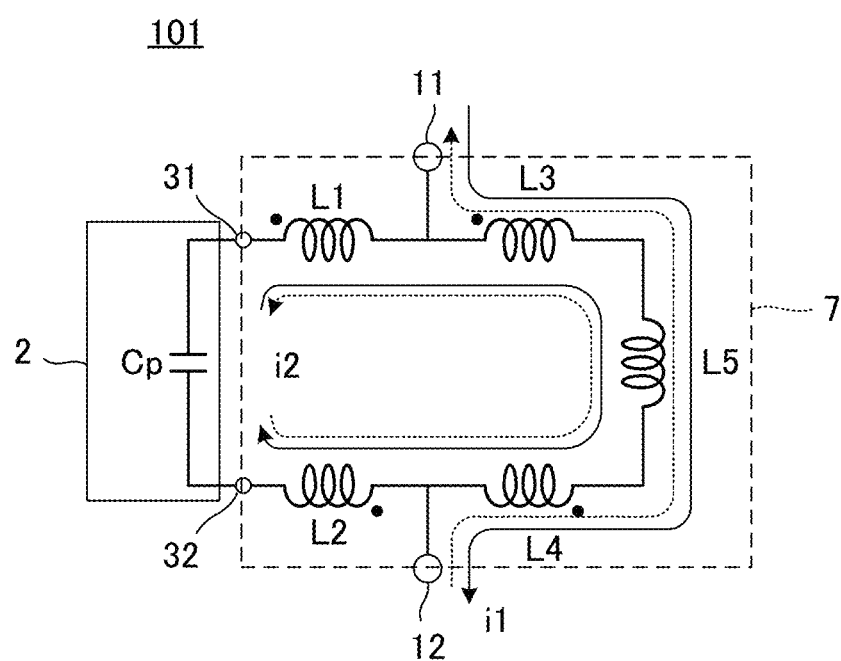
FIG. 2 is a circuit diagram of the RFIC module 101.

FIG. 2 is a circuit diagram of the RFIC module 101. As shown, the RFIC module 101 includes the RFIC 2 and an impedance matching circuit 7. The impedance matching circuit 7 includes the first inductor L1, the second inductor L2, the third inductor L3, the fourth inductor L4, and the fifth inductor L5. In the RFIC 2, there is an equivalent capacitor Cp connected to the RFIC connection first electrode 31 and the RFIC connection second electrode 32. The first inductor L1 and the third inductor L3 are magnetically coupled, and the second inductor L2 and the fourth inductor L4 are magnetically coupled. Dot symbols in FIG. 2 indicate coil winding directions of the respective inductor.

Figure 3:
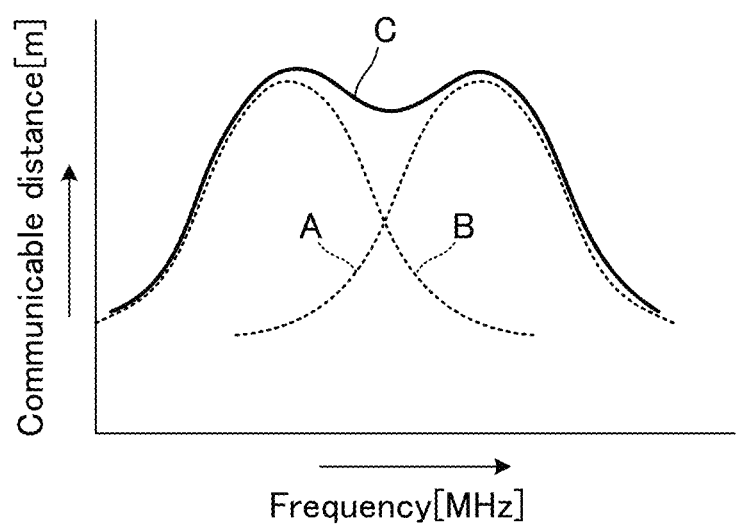
FIG. 3 is a diagram illustrating two resonance frequencies generated by an impedance matching circuit 7 illustrated in FIG. 2.

FIG. 3 is a diagram illustrating two resonance frequencies generated by the impedance matching circuit 7 illustrated in FIG. 2. In the RFIC module 101, two resonances occur. The first resonance is a resonance generated in a current path including the antenna 6, the third inductor L3, the fourth inductor L4, and the fifth inductor L5, and a current i1 illustrated in FIG. 2 represents a current flowing through the resonance current path. The second resonance is a resonance generated in a current path including the capacitor Cp, the first inductor L1, the second inductor L2, the third inductor L3, and the fifth inductor L5, and a current i2 illustrated in FIG. 2 represents a current flowing through the resonance current path.

The first resonance and the second resonance are coupled to each other via a third inductor L3, a fourth inductor L4, and a fifth inductor L5. According to an exemplary aspect, a difference of several tens of MHz (specifically, about 5 to 50 MHz) is generated between the resonance frequency of the first resonance and the resonance frequency of the second resonance. These resonance frequency characteristics are represented by curves A and B in FIG. 3. By combining two resonances having such resonance frequencies, a broadband resonance frequency characteristic as indicated by curve C in FIG. 3 can be obtained.

Figure 4A:
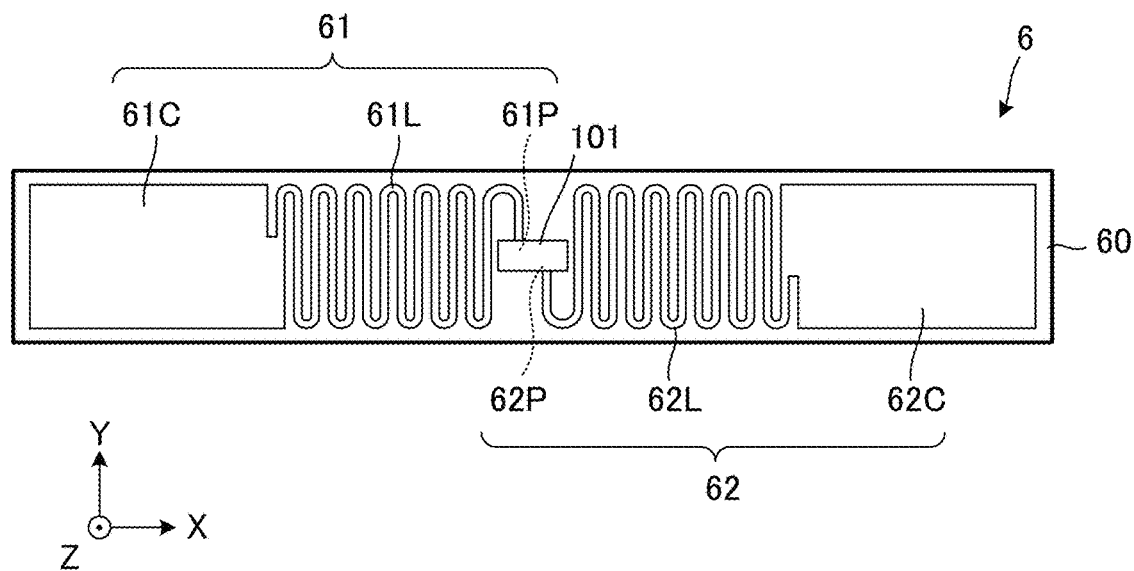
FIG. 4A is a plan view of an RFID tag 201.
Figure 4B:
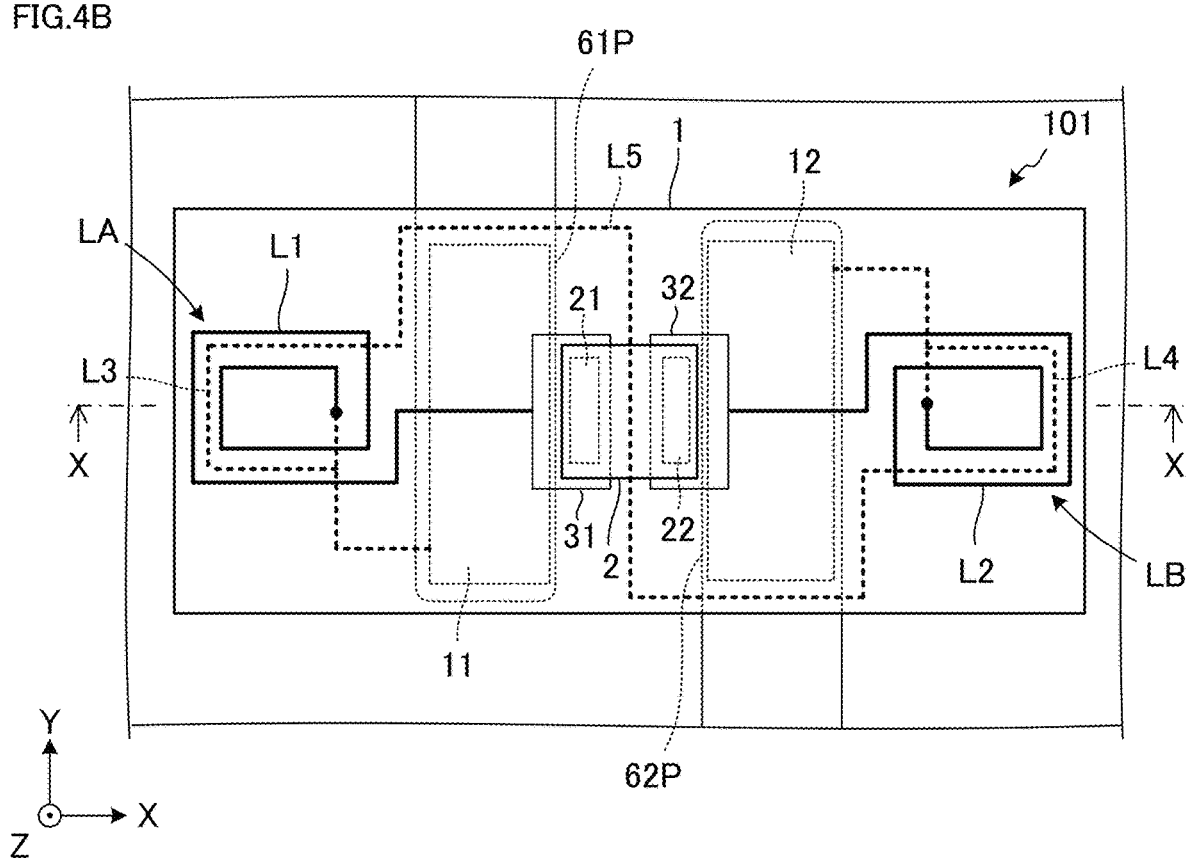
FIG. 4B is an enlarged plan view of a portion of the RFID tag 201 on which the RFIC module 101 is mounted.
Figure 5:
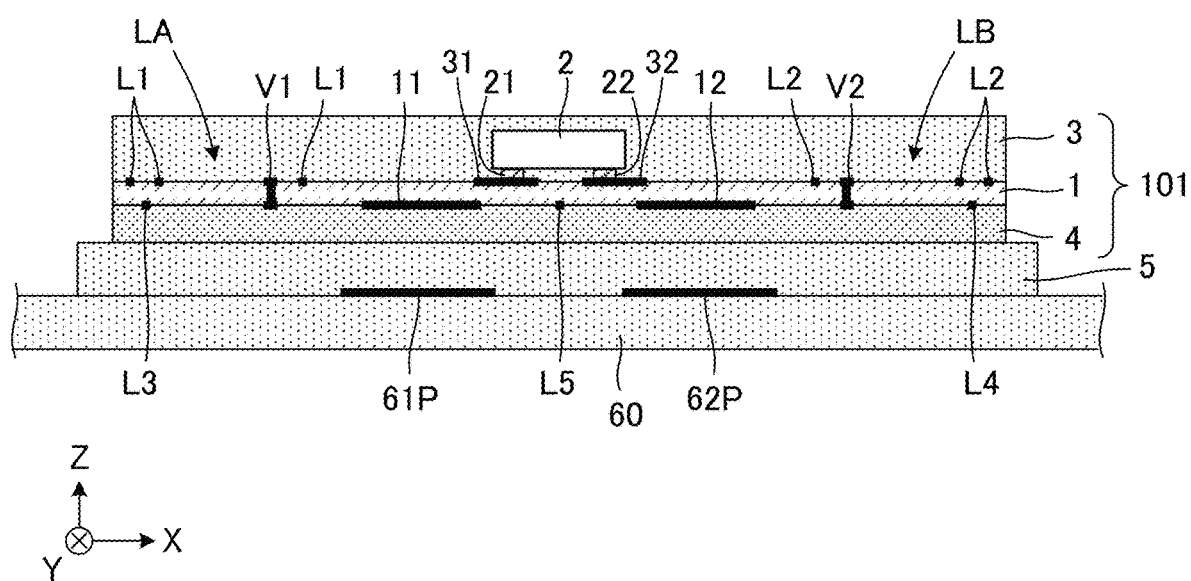
FIG. 5 is a vertical cross-sectional view an X-X portion in FIG. 4B.

FIG. 4A is a plan view of an RFID tag 201, and FIG. 4B is an enlarged plan view of a portion of the RFID tag 201 on which the RFIC module 101 is mounted. FIG. 5 is a vertical cross-sectional view an X-X portion in FIG. 4B. However, FIG. 4B is a plan view before a protective film (i.e., protective film 3 in FIG. 5) is formed by resin molding on the mounting surface of the RFIC 2 of the substrate 1.

As shown, the RFID tag 201 includes an antenna 6 and the RFIC module 101 coupled to the antenna 6. The antenna 6 includes an insulator film 60 and antenna conductor patterns 61 and 62 formed on the insulator film 60.

The antenna conductor pattern 61 includes conductor patterns 61P, 61L, and 61C, and the antenna conductor pattern 62 includes conductor patterns 62P, 62L, and 62C. The antenna conductor patterns 61 and 62 form a dipole antenna.

As illustrated in FIG. 5, a protective film 3 is formed on the upper surface of the RFIC module 101, and the lower surface is covered with a cover lay film 4. The RFIC module 101 is bonded to the insulator film 60 via the adhesive layer 5 to be mounted on the insulator film 60.

As illustrated in FIG. 5, the conductor pattern 61P and the antenna connection first electrode 11 are capacitively coupled via the adhesive layer 5 and the cover lay film 4. Similarly, the conductor pattern 62P and the antenna connection second electrode 12 are capacitively coupled via the adhesive layer 5 and the cover lay film 4.

In the exemplary aspect, the conductor patterns 61L and 62L have a meander line shape and serve as a high inductance component region. On the other hand, the conductor patterns 61C and 62C have a planar shape and serve as a high capacitance component region. With this configuration, the formation region where the antenna conductor patterns 61 and 62 are formed is downsized, with an inductance component provided in a high current intensity region increased and with a capacitance component provided in a high voltage intensity region increased.

Figure 8:
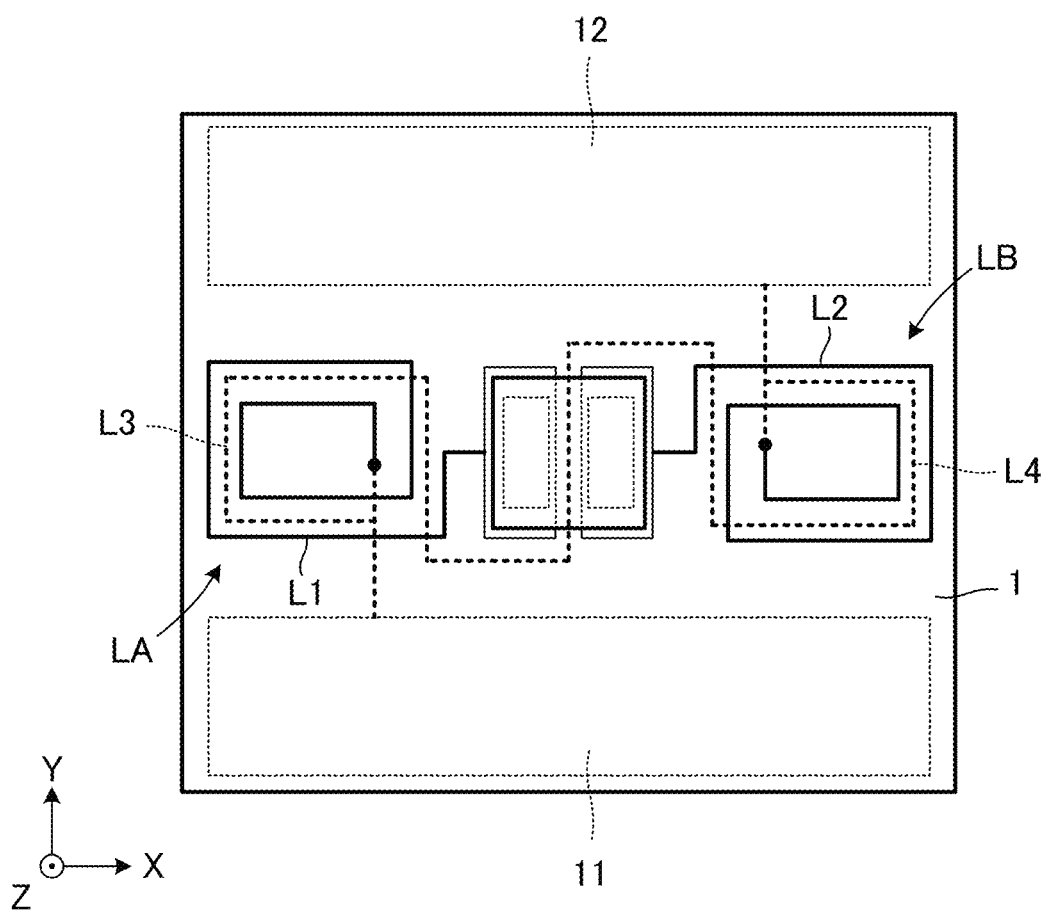
FIG. 8 is a plan view of an RFIC module of a comparative example.

Now, a plan view of an RFIC module of a comparative example is illustrated in FIG. 8. In the RFIC module of the comparative example, the first coil LA and the second coil LB are arranged in a positional relationship in which the first coil LA and the second coil LB are arranged between the antenna connection first electrode 11 and the antenna connection second electrode 12. Therefore, unwanted coupling between the first coil LA and the second coil LB is likely to occur. Furthermore, since the first coil LA and the second coil LB are electromagnetically shielded by the antenna connection first electrode 11 and the antenna connection second electrode 12, a leakage magnetic field to the outside is weak.

According to the present embodiment, since the antenna connection first electrode 11 and the antenna connection second electrode 12 are arranged (or otherwise positioned or disposed) between the first coil LA and the second coil LB along the plane direction (i.e., the X-Y direction or plane) of the substrate 1, the first coil LA is electromagnetically shielded from the second coil LB by the antenna connection first electrode 11 and the antenna connection second electrode 12, whereby unwanted coupling between the first coil LA and the second coil LB is suppressed. Furthermore, with the coupling between the first coil LA and the second coil LB suppressed, the leakage magnetic field from the first coil LA or the second coil LB to the outside becomes strong.

Figure 6:
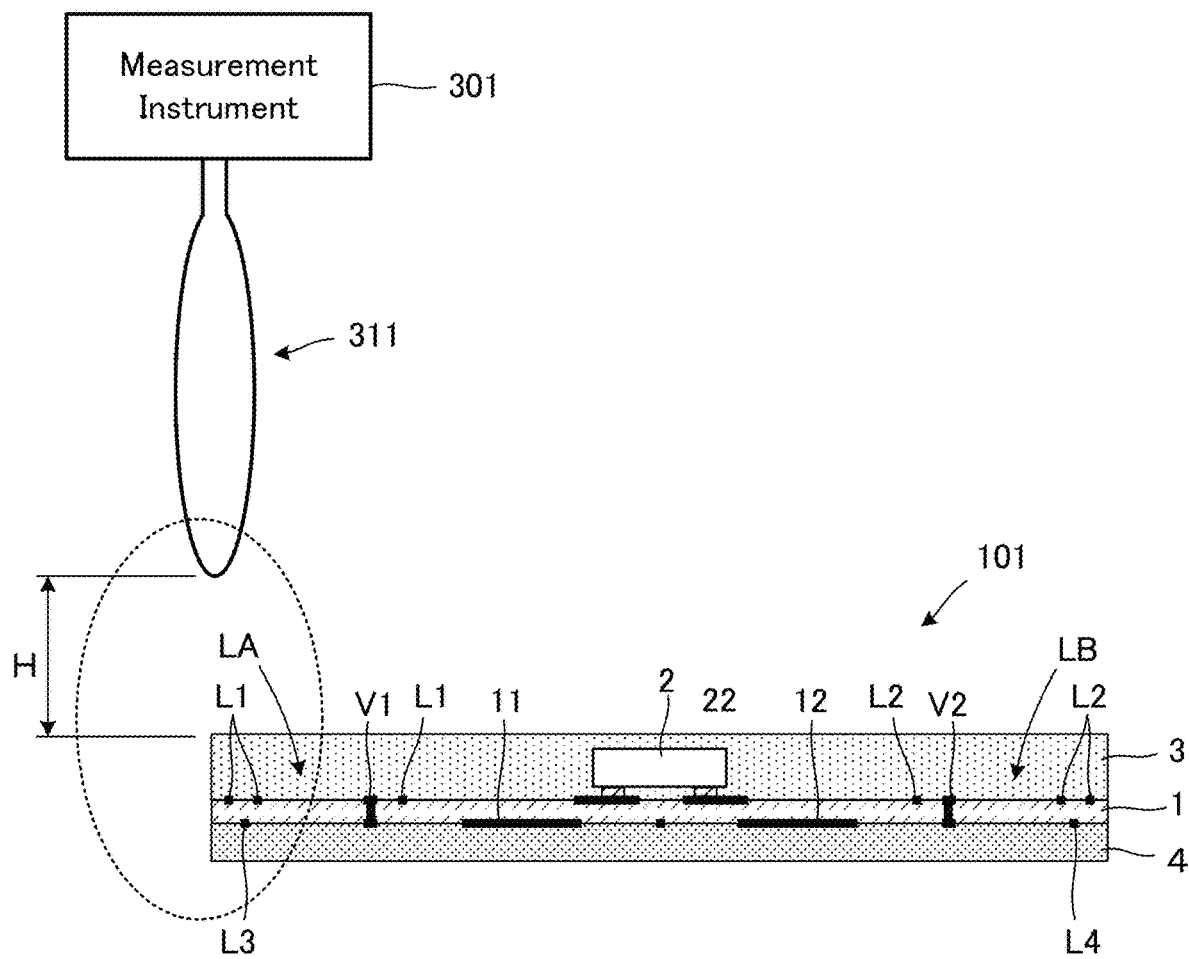

FIG. 6 is a view illustrating a relationship between the RFIC module 101 and a measurement instrument 301 and the like. A magnetic field probe 311 is connected to the measurement instrument 301. In the example illustrated in FIG. 6, magnetic fluxes are interlinked with the coil opening of the first coil LA and the coil opening of the magnetic field probe 311. As a result, the first coil LA and the magnetic field probe 311 are magnetically coupled. In FIG. 6, the magnetic flux contributing to the coupling is indicated by a broken line.

As described above, according to the present embodiment, the leakage magnetic field from the first coil LA or the second coil LB to the outside becomes strong, resulting in stronger magnetic field coupling between the first coil LA or the second coil LB and the magnetic field probe 311 of the measurement instrument 301. Therefore, even when a distance H between the RFIC module 101 and the magnetic field probe 311 is somewhat large, that is, even in a state where the magnetic field probe 311 is not in contact with the RFIC module 101, the RFIC module 101 can be inspected.

Second Exemplary Embodiment

In a second exemplary embodiment, an RFIC module in which the arrangement relationship of the antenna connection first electrode 11 and the antenna connection second electrode 12 with respect to the first coil LA and the second coil LB is different from that in the example described in the first embodiment will be described.

Figure 7:
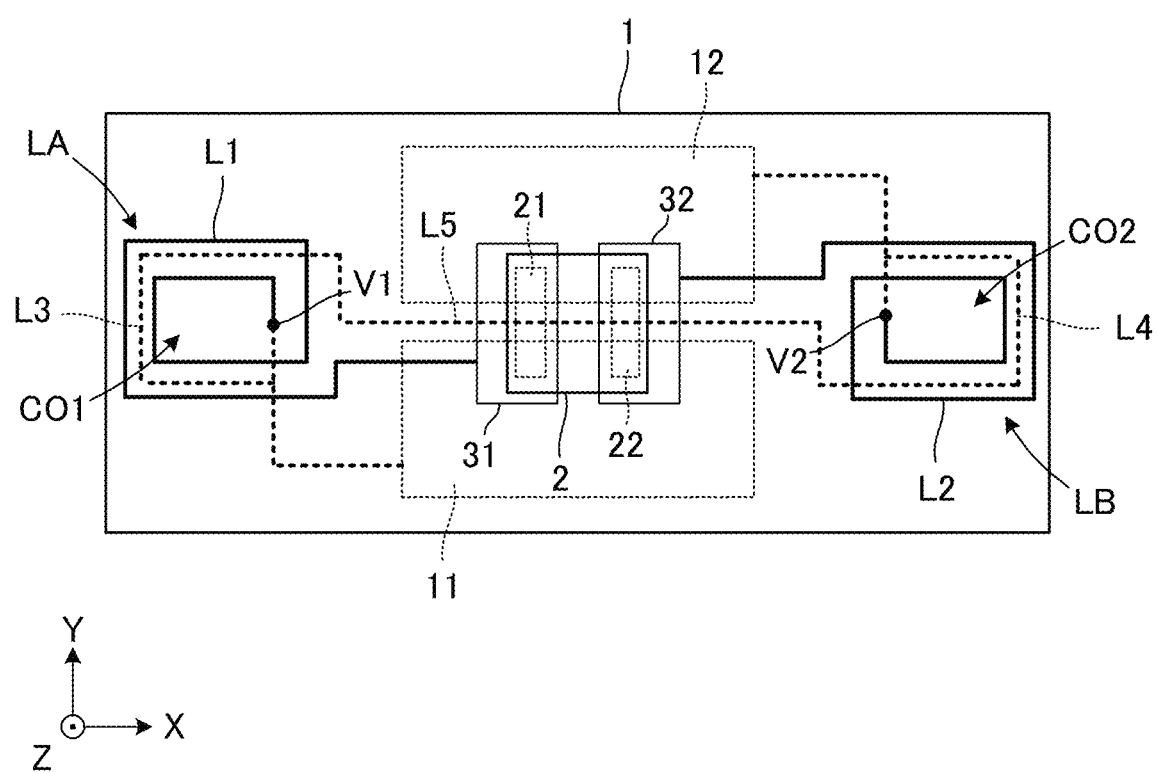
FIG. 7 is an enlarged plan view of an RFIC module 102 according to a second exemplary embodiment.

FIG. 7 is an enlarged plan view of an RFIC module 102 according to the second embodiment. The RFIC module 102 includes an RFIC 2, an antenna connection first electrode 11, an antenna connection second electrode 12, an RFIC connection first electrode 31, an RFIC connection second electrode 32, an impedance matching circuit, and a substrate 1.

In the exemplary embodiment of FIG. 1 as described above, the arrangement direction of the antenna connection first electrode 11 and the antenna connection second electrode 12 is the same as the arrangement direction of the first coil LA and the second coil LB, that is, both are parallel to and extending in the X axis. On the other hand, in the second embodiment, the arrangement direction of the antenna connection first electrode 11 and the antenna connection second electrode (parallel to and extending in the Y axis) is orthogonal to the arrangement direction of the first coil LA and the second coil LB (parallel to and extending in the X axis). The other configuration is as described in the first embodiment.

According to the second embodiment, as in the first embodiment, unwanted coupling between the first coil LA and the second coil LB is suppressed. Furthermore, stronger magnetic coupling between the first coil LA or the second coil LB and the magnetic field probe 311 of the measurement instrument 301 is achieved, so that the inspection can be performed with the RFIC module 101 alone.

In general, it is noted that the above description of the embodiments is illustrative in all respects and not restrictive. Those skilled in the art can make modifications and changes as appropriate.

For example, in any of the embodiments described above, an example is described in which a straight line passing through the center of gravity of the coil opening of the first coil LA and the center of gravity of the coil opening of the second coil LB passes through the center of the contour including the antenna connection first electrode 11 and the antenna connection second electrode 12 (formation range of the antenna connection first electrode 11 and the antenna connection second electrode 12), but the straight line does not necessarily pass through the center in an alternative aspect.

For example, in any of the embodiments described above, the impedance matching circuit includes the first inductor L1, the second inductor L2, the third inductor L3, the fourth inductor L4, and the fifth inductor L5, but the exemplary embodiments of the present invention are not limited to this configuration.

In addition, an example in which the first coil LA includes the coil for the first inductor L1 and the coil for the third inductor L3, and the second coil LB includes the coil for the second inductor L2 and the coil for the fourth inductor L4 is described, but the exemplary embodiments of the present invention are not limited to this configuration. For example, an exemplary embodiment of the present invention can be similarly applied to a case where each of the first coil LA and the second coil LB is made up of a single coil.

Furthermore, an example is described in which in the RFIC modules 101 and 102 in any of the embodiments described above, a capacitor is formed between the antenna connection first electrode 11 and the antenna conductor pattern 61P, and a capacitor is formed between the antenna connection second electrode 12 and the antenna conductor pattern 62P. However, the "connection" is not limited to connection via the capacitor, and may be direct current connection in an alternative aspect.

REFERENCE SIGNS LIST

CO1, CO2 coil opening
Cp capacitor
L1 first inductor
L2 second inductor
L3 third inductor
L4 fourth inductor
L5 fifth inductor
LA first coil
LB second coil
V1, V2 interlayer connection conductor
1 substrate
2 RFIC
3 protective film
4 cover lay film
5 adhesive layer
6 antenna
7 impedance matching circuit
11 antenna connection first electrode
12 antenna connection second electrode
21, 22 RFIC terminal electrode
31 RFIC connection first electrode
32 RFIC connection second electrode
60 insulator film
61, 62 antenna conductor pattern
61P, 61L, 61C, 62P, 62L, 62C conductor pattern
101, 102 RFID tag RFIC module
201 RFID tag
301 measurement instrument
311 magnetic field probe

The invention claimed is:

1. An RFID tag RFIC module comprising:
a substrate;
an RFIC mounted on the substrate;
an antenna connection first electrode;
an antenna connection second electrode;
an RFIC connection first electrode;
an RFIC connection second electrode; and
an impedance matching circuit that is connected to the RFIC connection first electrode, the RFIC connection second electrode, the antenna connection first electrode, and the antenna connection second electrode, with the impedance matching circuit configured to match impedance between the RFIC and an antenna,
wherein the RFIC connection first electrode, the RFIC connection second electrode, the antenna connection first electrode, the antenna connection second electrode, and the impedance matching circuit are formed on the substrate,
wherein the impedance matching circuit includes a first coil and a second coil that are connected to the RFIC connection first electrode and the RFIC connection second electrode, with the first coil and the second coil each having a coil opening that extends along a surface of the substrate,
wherein the first coil and the second coil are juxtaposed on the substrate with the antenna connection first electrode and the antenna connection second electrode interposed therebetween relative to a direction parallel to the surface of the substrate,
wherein the first coil includes a coil forming a first inductor connected to the RFIC connection first electrode and the antenna connection first electrode and a coil forming a third inductor connected in series between the antenna connection first electrode and the antenna connection second electrode, and
wherein the second coil includes a coil forming a second inductor connected to the RFIC connection second electrode and the antenna connection second electrode and a coil forming a fourth inductor connected in series between the antenna connection first electrode and the antenna connection second electrode.

2. The RFID tag RFIC module according to claim 1, wherein a coil opening of the first inductor and a coil opening of the third inductor overlap each other in a direction orthogonal to the surface of the substrate, and wherein a coil opening of the second inductor and a coil opening of the fourth inductor overlap each other in the direction orthogonal to the surface of the substrate.

3. The RFID tag RFIC module according to claim 1, wherein the first inductor and the second inductor are disposed on a first surface of the substrate and the third inductor and the fourth inductor are disposed on a second surface of the substrate that is opposite the first surface.

4. The RFID tag RFIC module according to claim 1, wherein each of the antenna connection first electrode, the antenna connection second electrode, the first coil and the second coil have an arrangement direction that extends in a lengthwise direction of the substrate.

5. The RFID tag RFIC module according to claim 1, wherein the first coil and the second coil are disposed adjacent to respective sides of the substrate in a lengthwise direction thereof, and the antenna connection first and second electrodes have an arrangement direction relative to each other in a widthwise direction of the substrate.

6. The RFID tag RFIC module according to claim 1, wherein the first inductor is connected to the third inductor by a first interlayer connection conductor extending through the substrate, and the second inductor is connected to the fourth inductor through a second interlayer connection conductor extending through the substrate.

7. The RFID tag RFIC module according to claim 1, further comprising first RFIC terminal electrode and second RFIC terminal electrode formed on a lower surface of the RFIC and connected to the RFIC connection first electrode and the RFIC connection second electrode, respectively.

8. An RFID tag comprising:
an antenna;
a substrate;
an RFIC mounted on the substrate;
an antenna connection first electrode;
an antenna connection second electrode;
an RFIC connection first electrode;
an RFIC connection second electrode; and
an impedance matching circuit that is connected to the RFIC connection first electrode, the RFIC connection second electrode, the antenna connection first electrode, and the antenna connection second electrode, with the impedance matching circuit configured to match impedance between the RFIC and the antenna,
wherein the RFIC connection first electrode, the RFIC connection second electrode, the antenna connection first electrode, the antenna connection second electrode, and the impedance matching circuit are formed on the substrate,
wherein the impedance matching circuit includes a first coil and a second coil that are connected to the RFIC connection first electrode and the RFIC connection second electrode and each have a coil opening that extends along a surface of the substrate,
wherein the first coil and the second coil are juxtaposed on the substrate with the antenna connection first electrode and the antenna connection second electrode interposed therebetween relative to a direction parallel to the surface of the substrate,
wherein the first coil includes a coil forming a first inductor connected to the RFIC connection first electrode and the antenna connection first electrode and a coil forming a third inductor connected in series between the antenna connection first electrode and the antenna connection second electrode, and
wherein the second coil includes a coil forming a second inductor connected to the RFIC connection second electrode and the antenna connection second electrode and a coil forming a fourth inductor connected in series between the antenna connection first electrode and the antenna connection second electrode.

9. The RFID tag according to claim 8,
wherein a coil opening of the first inductor and a coil opening of the third inductor overlap each other in a direction orthogonal to the surface of the substrate, and
wherein a coil opening of the second inductor and a coil opening of the fourth inductor overlap each other in the direction orthogonal to the surface of the substrate.

10. The RFID tag according to claim 8, wherein the first inductor and the second inductor are disposed on a first surface of the substrate and the third inductor and the fourth inductor are disposed on a second surface of the substrate that is opposite the first surface.

11. The RFID tag according to claim 8, wherein each of the antenna connection first electrode, the antenna connection second electrode, the first coil and the second coil have an arrangement direction that extends in a lengthwise direction of the substrate.

12. The RFID tag according to claim 8, wherein the first coil and the second coil are disposed adjacent to respective sides of the substrate in a lengthwise direction thereof, and the antenna connection first and second electrodes have an arrangement direction relative to each other in a widthwise direction of the substrate.

13. The RFID tag according to claim 8, wherein the first inductor is connected to the third inductor by a first interlayer connection conductor extending through the substrate, and the second inductor is connected to the fourth inductor through a second interlayer connection conductor extending through the substrate.

14. The RFID tag according to claim 8, further comprising first RFIC terminal electrode and second RFIC terminal electrode formed on a lower surface of the RFIC and connected to the RFIC connection first electrode and the RFIC connection second electrode, respectively.

15. The RFID tag according to claim 8, wherein the antenna includes an insulator film and a conductor pattern formed on the insulator film, and the substrate is mounted on the insulator film.

16. The RFID tag according to claim 8, wherein the antenna comprises a pair of meandering lines extending in opposite directions from each other and that are configured as inductance component regions, and the antenna further comprises a pair of planar shapes extending from the meandering lines, respectively, and that are configured as capacitance component regions.

* * * * *